(12) United States Patent
Yamazaki et al.

(10) Patent No.: US 7,952,097 B2
(45) Date of Patent: May 31, 2011

(54) SEMICONDUCTOR DEVICE AND METHOD OF FABRICATING THE SAME

(75) Inventors: Shunpei Yamazaki, Tokyo (JP); Yasuhiko Takemura, Shiga (JP); Hongyong Zhang, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 2446 days.

(21) Appl. No.: 09/917,633

(22) Filed: Jul. 31, 2001

(65) Prior Publication Data

US 2001/0045559 A1    Nov. 29, 2001

Related U.S. Application Data

(60) Division of application No. 09/848,307, filed on May 4, 2001, now Pat. No. 6,413,842, which is a division of application No. 09/334,645, filed on Jun. 17, 1999, now Pat. No. 6,232,621, which is a division of application No. 08/821,656, filed on Mar. 20, 1997, now Pat. No. 5,985,741, which is a continuation of application No. 08/486,218, filed on Mar. 7, 1995, now abandoned, which is a continuation-in-part of application No. 08/195,713, filed on Feb. 14, 1994, now abandoned.

(30) Foreign Application Priority Data

Feb. 15, 1993   (JP) .......................... 5-48534

(51) Int. Cl.
*H01L 29/04*   (2006.01)
*H01L 31/036*  (2006.01)

(52) U.S. Cl. ............ 257/64; 257/66; 257/69; 257/70; 257/72

(58) Field of Classification Search .............. 257/64, 257/66, 69, 70, 72
See application file for complete search history.

(56) References Cited

U.S. PATENT DOCUMENTS

| | | | |
|---|---|---|---|
| 3,783,049 | A | 1/1974 | Sandera |
| RE28,385 | E | 4/1975 | Mayer |
| RE28,386 | E | 4/1975 | Heiman et al. |
| 4,231,809 | A | 11/1980 | Schmidt |
| 4,727,044 | A | 2/1988 | Yamazaki |
| 4,783,049 | A | 11/1988 | Northman et al. |

(Continued)

FOREIGN PATENT DOCUMENTS

GB    2 167 899 A    6/1986

(Continued)

OTHER PUBLICATIONS

Millman, . . . , pp. 278-282, 1982.

(Continued)

*Primary Examiner* — Thien F Tran
(74) *Attorney, Agent, or Firm* — Nixon Peabody LLP; Jeffrey L. Costellia

(57) ABSTRACT

A method for improving the reliability and yield of a thin film transistor by controlling the crystallinity thereof. The method comprises the steps of forming a gate electrode on an island amorphous silicon film, injecting an impurity using the gate electrode as a mask, forming a coating film containing at least one of nickel, iron, cobalt, platinum and palladium so that it adheres to parts of the impurity regions, and annealing it at a temperature lower than the crystallization temperature of pure amorphous silicon to advance the crystallization starting therefrom and to crystallize the impurity regions and channel forming region.

16 Claims, 5 Drawing Sheets

U.S. PATENT DOCUMENTS

| | | | |
|---|---|---|---|
| 4,959,700 | A | 9/1990 | Yamazaki |
| 5,075,259 | A | 12/1991 | Moran |
| 5,147,826 | A | 9/1992 | Liu et al. |
| 5,219,786 | A | 6/1993 | Noguchi |
| 5,225,355 | A | 7/1993 | Sugino et al. |
| 5,244,819 | A | 9/1993 | Yue |
| 5,264,383 | A | 11/1993 | Young |
| 5,275,851 | A | 1/1994 | Fonash et al. |
| 5,289,030 | A | 2/1994 | Yamazaki et al. |
| 5,298,075 | A | 3/1994 | Lagendijk et al. |
| 5,300,187 | A | 4/1994 | Lesk et al. |
| 5,352,291 | A | 10/1994 | Zhang et al. |
| 5,403,772 | A * | 4/1995 | Zhang et al. .................. 438/166 |
| 5,488,000 | A | 1/1996 | Zhang et al. |
| 5,492,843 | A | 2/1996 | Adachi et al. |
| 5,508,533 | A | 4/1996 | Takemura |
| 5,529,937 | A | 6/1996 | Zhang et al. |
| 5,569,936 | A | 10/1996 | Zhang et al. |
| 5,595,944 | A | 1/1997 | Zhang et al. |
| 5,604,360 | A * | 2/1997 | Zhang et al. .................... 257/72 |
| 5,608,232 | A | 3/1997 | Yamazaki et al. |
| 5,646,424 | A | 7/1997 | Zhang et al. |
| 5,773,327 | A | 6/1998 | Yamazaki et al. |
| 5,818,076 | A | 10/1998 | Zhang et al. |
| 5,897,347 | A | 4/1999 | Yamazaki et al. |
| 5,985,741 | A | 11/1999 | Yamazaki et al. |
| 6,097,037 | A * | 8/2000 | Joo et al. ......................... 257/55 |

FOREIGN PATENT DOCUMENTS

| | | |
|---|---|---|
| JP | 45-022173 | 7/1970 |
| JP | 61-119079 | 6/1986 |
| JP | 61-201460 | 9/1986 |
| JP | 62-245674 | 10/1987 |
| JP | 63-142807 | 6/1988 |
| JP | 64-035958 | 2/1989 |
| JP | 02-42419 | 2/1990 |
| JP | 02-140915 | 5/1990 |
| JP | 02-222546 | 9/1990 |
| JP | 04-100211 | 4/1992 |
| JP | 04-139728 | 5/1992 |

OTHER PUBLICATIONS

Oana, "16.3: A 240×360 Element Active Matrix LCD with Integrated Gate-Bus Drivers Using Poly-Si TFTS", pp. 312-315, 1984, SID 84 Digest.

Troxell, "16.7: Polysilicon Thin-Film Transistors on a Novel 800 < Glass Substrate", pp. 298-300, 1986, SID 86 Digest.

Wolf, "Silicon Processing For the VLSI Era", pp. 144-146, ., Lattice Press, vol. 2, 1990.

Wu, "17.2: Performance of Polysilicon TFT Digital Circuit Fabricated with Various Processing Techniques and Device Architechtures", pp. 307-310, 1990, SID 90 Digest.

Yamaguchi, "Drastically Improved Performance in Poly-Si TFT6 with Channel Dimensions Comparable to Grain Size", pp. 353-355, 1989, IEDM 89.

Fortuna et al., "Ion Beam Induced Si Crystallization from a Silicide Interface", pp. 264, 1993, Appl. Surf. Sci., vol. 73.

"Encyclopedia Semiconductor and Integrated Circuit", pp. 272.

Daieisha, "Silicon Integrated Circuit Step Technics", pp. 147-148, 108-111, 1991.

Cammarata, "Silicide Precipitation and Silicon Crystallization in Nickel Implanted Amorphous Silicon Thin Films", pp. 2133-2138, ., Journal of Materials Res., vol. 5, Oct. 1990.

Caune, "Combined CW Laser and Furnace Annealing of Amorphous Si and GE in Contact with Some Metals", pp. 597-604, ., Applied Surface Science, vol. 36, 1989.

Dvurechenskii, "Transport Phenomena in Amorphous Silicon Doped by Ion Implantation of 3D Metals", pp. 635-640, ., Phys. Stat. Sol, Jun. 1986.

Fortuna, "In Situ Study of Ion Beam Induced Si Crystallization From a Silicide Interface", pp. 264-267, ., Applied Surface Science, vol. 73, Nov. 1993.

Gong, "Thermodynamic Investigations of Solid-State Si-Metal Interactions LL. General Analysis of Si-Metal Binary Systems", pp. 4542-4549, ., J. Appl. Phys., vol. 68, Nov. 1990.

Green, "Method to Purify Semiconductor Wafers", pp. 1612-1613, ., IBM Technical Disclosure Bulletin, vol. 16, Oct. 1973.

Hayzelden, "In Situ Transmission Electron Microscopy Studies of Silicid-Mediated Crystallization of Amorphous Silicon", pp. 225-227, ., Appl. Phys. Lett., vol. 60, Jan. 1992.

Hemple, "Needle-Like Crystallization of NI Doped Amorphous Silicon Thin Films", pp. 921-924, ., Solid State Communications, vol. 85, Mar. 1993.

Kakkad, "Crystallized Si Films by Low-Temperature Rapid Thermal Annealing of Amorphous Silicon", pp. 2069-2072, ., J. Appl. Phys., vol. 65, Mar. 1989.

Kakkad, "Low Temperature Selective Crystallization of Amorphous Silicon", pp. 66-68, ., Journal of Non-Crystalline Solids, vol. 115, Dec. 1989.

Fortuna, "In Situ Study of Ion Beam Induced Si Crystallization From a Silicide Interface", pp. 264-267, ., Applied Surface Science, vol. 73, Nov. 1993.

Kuznetsov, "Transient Kinetics in Solid Phase Epitaxy of NI Doped Amorphous Silicon", pp. 261-264, .., Nuclear Instruments & Methods in Physics Research, vol. 96, Mar. 1995.

Lee, "Low Temperature Poly-Si TFT Fabrication by Nickel-Induced Lateral Crystallization of Amorphous Silicon Films", pp. 113-116, ., AM-LCD 95, 1995.

Lee, "PD Induced Lateral Crystallization of Amorphous Si Thin Films", pp. 1671-1673, ., Appl. Phys. Lett., vol. 66, 1995.

Liu, "Selective Area Crystallization of Amorphous Silicon Films by Low-Temperature Rapid Thermal Annealing", pp. 660-662, ., Appl. Phys. Lett., vol. 55, 1989.

Liu, "Polycrystalline Silicon Thin Film Transistor on Corning 7059 Glass Substrates Using Short Time", pp. 2554-2556, ., Appl. Phys. Lett., vol. 62, May 1993.

* cited by examiner

SEMICONDUCTOR DEVICE AND METHOD OF FABRICATING THE SAME

BACKGROUND OF THE INVENTION

1. Field of the Invention

The present invention relates to a method of obtaining a crystalline semiconductor used for thin film devices such as a thin film insulated gate type field effect transistor (thin film transistor or TFT).

2. Description of the Related Art

Conventionally, a crystalline semiconductor thin film used for thin film devices such as a thin film insulated gate type field effect transistor (TFT) has been fabricated by crystallizing an amorphous silicon film formed by a plasma CVD method or thermal CVD method at a temperature of more than 600° C. in an apparatus such as an electric furnace.

This conventional method, however, has had various problems. The biggest problem has been that it is difficult to obtain a good product because the crystalline silicon film obtained is polycrystal and there is difficulty in controlling its grain boundary, and its reliability and yield is not so high because of its dispersion characteristic. That is, because the silicon crystals obtained by conventional heat treatment grow totally at random, it has been almost impossible to control the direction of its crystal growth.

Accordingly, it is an object of the present invention to solve the aforementioned problems by providing a method for controlling the growth of the crystal.

SUMMARY OF THE INVENTION

According to the present invention, crystal growth is controlled, and a TFT having high reliability and high yield is obtained, by forming a gate electrode on a silicon film in an amorphous state or in a random crystal state (for example a state in which portions having goad crystallinity and amorphous portions exist in a mixed state) which can be said to be a substantially amorphous state, by forming impurity regions within the silicon film using the gate electrode as a mask, forming regions containing at least one of nickel, iron, cobalt platinum or palladium so that they adhere on part of the impurity regions, and by annealing the whole to crystallize it starting from the region containing nickel.

In particular, the present invention allows substantial elimination of the grain boundary between the source and drain and the active layer and to obtain a good characteristic by advancing the crystallization of the source and drain at the same time as the crystallization of the active layer (channel forming region).

A method of growing a crystal of silicon film epitaxially in solid phase centering on a crystalline island film as a nucleus or as a seed crystal has been proposed as a prior art method (for example, Japanese Patent Laid-Open No. 1-214110, etc.). However, it has been difficult to suppress crystal growth from other sites even if the crystal nucleus exists. That is, because the annealing temperature for growing the crystal is a temperature suited for fully generating the crystal nucleus, the crystal often starts to grow from unexpected locations.

The inventor of the present invention found that nickel (Ni), cobalt, iron platinum and palladium are readily coupled with silicon and that the crystal would grow centering on them. The inventor noticed that nickel is readily made into nickel silicide ($NiS_x$, $0.4 \leq x \leq 2.5$) and that the lattice constant of the nickel silicide is close to that of silicon crystal, then devised a method of growing a silicon crystal centering on the nickel silicide. Actually, the crystal growing temperature could be lowered by 20° C. to 150° C. compared to that of the conventional method. Because no crystal nucleus was produced in a pure silicon film at this temperature, crystals did not grow from unexpected locations. It was assumed that the crystal grew from the crystal nucleus by the same mechanism as the conventional one and that the higher the temperature, the faster the speed of advancement of the crystallization, at temperatures at which crystal nuclei did not grow naturally (preferably less than 580° C.). A similar effect was seen also with iron (Fe), cobalt (Co) platinum (Pt) and palladium (Pd).

According to the present invention, a film or the like containing a simple substance of nickel, iron, cobalt, platinum or palladium or their silicides, acetates, nitrates and other organic acid salts is adhered to the impurity regions of the thin film transistor, and the region of the crystal silicon is expanded away therefrom as the starting point. By the way, oxide is not preferable as the material containing the aforementioned material because oxide is a stable compound and a silicide which is likely to become the crystal nucleus is not produced therefrom.

The crystal silicon which expands thus from a specific location has a structure close to a monocrystal having good continuous crystallinity. A better result could be obtained with an amorphous silicon film having less hydrogen concentration serving as the starting material for crystallization. However, because hydrogen was released as crystallization advanced, no clear correlation could be seen between the hydrogen concentration within the silicon film obtained and that of the amorphous silicon film as the starting material. The hydrogen concentration within the crystal silicon of the present invention was typically more than $1 \times 10^{15}$ atoms·cm$^{-3}$ 0.01 atomic % and less than 5 atomic %.

While a heavy metal material such as nickel, iron, cobalt or platinum or palladium is used in the present invention, those material themselves are not suitable for silicon as a semiconductor material. It is therefore necessary to remove them if those elements are contained in excess. It was found from a result of the study conducted by the inventor that nickel can be fully removed by annealing it in an atmosphere of hydrogen chloride, various methane chlorides ($CH_3Cl$ etc.), various ethane chlorides ($C_2H_3Cl_3$, etc.) and various ethylene chlorides ($C_2HCl_3$, etc.) at 400 to 650° C. It was found that the concentration of nickel, iron, cobalt, platinum or palladium within the silicon film of the present invention was preferably set at $1 \times 10^{15}$ cm$^{-3}$ to 1 atomic %, or the minimum concentration of nickel, iron, cobalt, platinum and palladium was more preferably $1 \times 10^{15}$ cm$^{-3}$ to $1 \times 10^{19}$ cm$^{-3}$ with a measured value of SIMS. Crystallization does not fully advance at a concentration less than this range and, conversely, characteristics and reliability are degraded when the concentration exceeds this range.

Various physical and chemical methods may be used for forming film nickel, iron, cobalt, platinum or palladium. They are, for example, those methods which require vacuum equipment such as a vacuum deposition method, sputtering method and CVD method and those methods which may be performed in air such as a spin coating method, dip method (application method), doctor blade method, screen printing method and spray thermal decomposition method.

Even though the spin coating method and dip method require no particular facility, they allow production of a film having a homogeneous film thickness and minute control of the concentration. As a solution used for these means, whatever acetates, nitrates or various carboxylic acid salts or other organic acid salts of nickel, iron, cobalt, platinum or palladium dissolve or diffuse in water, various alcohols (low and high grades) and petroleums (saturated hydrocarbons or unsaturated hydrocarbons) may be used.

In such a case, however, there has been the possibility that oxygen and carbon contained in those salts might diffuse within the silicon film, degrading the semiconductor characteristics. However, as a result of research advanced by a thermobalance method and differential thermal analysis, it was confirmed that they are decomposed into oxide or a simple substance in an adequate material at a temperature of less than 450° C., and that they would not diffuse into the silicon film thereafter. When such low order substances as the acetate and nitrate were heated under a reduced atmosphere such as a nitrogen atmosphere, they decomposed at less than 400° C. and became a simple metallic substance. Similarly, it was observed that when they were heated in an oxygen atmosphere, oxide was initially produced and eventually become a metallic simple substance as oxygen desorbed at higher temperatures.

The manner in which the foregoing and other objects of the present invention are accomplished will become apparent from the accompanying specification and claims, taken together with the drawings.

DETAILED DESCRIPTION OF PREFERRED EMBODIMENTS

Figure 1A:
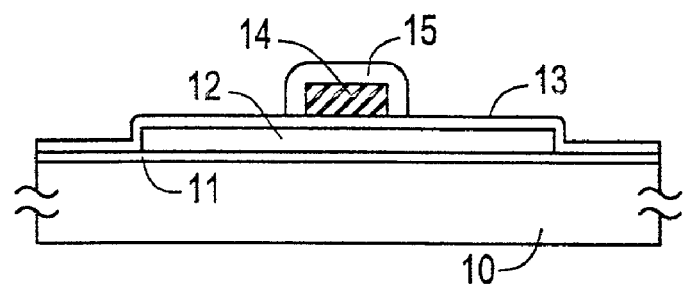
FIGS. 1(A) to 1(C) are section views showing a process of an embodiment of the present invention (refer to first embodiment)

Referring now to the drawings, preferred embodiments of the present invention will be explained.

First Embodiment

A ground silicon oxide film 11 having a thickness of 2000 angstroms was formed on a substrate (Corning 7059) 10 by a plasma CVD method. Further, an amorphous silicon film having a thickness of 200 to 3000 angstroms or preferably 500 to 1500 angstroms was fabricated by a plasma CVD or vacuum CVD method. The amorphous silicon film could be easily crystallized by reducing hydrogen concentration within the film to less than atomic % by dehydrogenizing it by annealing for 0.1 to 2 hours at a temperature of from 350 to 450° C. It was then patterned to form an island silicon region 12. Then a silicon oxide film 13 having a thickness of 500 to 1500 angstroms which functions as a gate insulating film was formed by a RF plasma CVD, ECR plasma CVD or sputtering method. A favorable result could be obtained by using TEOS (tetraethoxisillane) and oxygen as original gases when the plasma CVD method was adopted. Then a tantalum film (5000 angstroms thick) containing 1% of silicon was deposited by a sputtering method and was patterned to form gate wiring and an electrode 14. Titanium, silicon, chromium or aluminum may be used as the material of the gate electrode.

Then, the substrate was soaked in an ethylene glycol solution of 3% tartaric acid and was anodized by setting platinum as the cathode and tantalum wire as the anode and circulating a current therebetween. The current was applied such that its voltage rises 2V/min. and becomes constant when it reaches 220 V. The current was stopped when it was reduced to less than 10 micro $A/m^2$. As a result, an anodic oxide (tantalum oxide) 15 having a thickness of 2000 angstroms was formed. Similarly, titanium oxide, aluminum oxide or silicon oxide can be obtained as an anodic oxide when titanium, aluminum or silicon is used for the gate electrode (FIG. 1(A)).

Figure 1B:
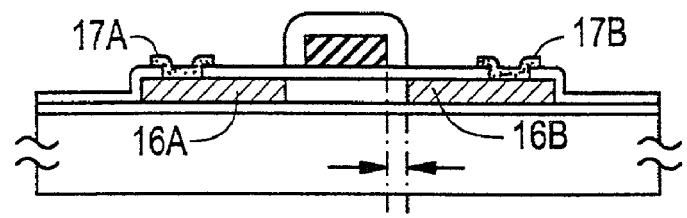

Next, an impurity was introduced by a plasma doping method. For the doping gas, phosphine ($PH_3$) was used for a N type TFT and diborane ($B_2H_6$) was used for a P type TFT. The N type TFT is shown in the figure. The acceleration voltage was 80 key for phosphine and 65 keV for diborane. Impurity regions 16A and 16B were thus formed. At this time, the impurity regions and the gate electrode were offset as seen in the figure. Further, holes were created on the silicon oxide film 13 on the impurity regions to form nickel silicide (or nickel) films 17A and 17B so that they adhere to the semiconductor region 12 through the holes. Then annealing was carried out in a nitrogen atmosphere at 550° C. for four hours to crystallize the impurity regions 16 and other semiconductor regions (FIG. 1(B)).

Figure 1C:
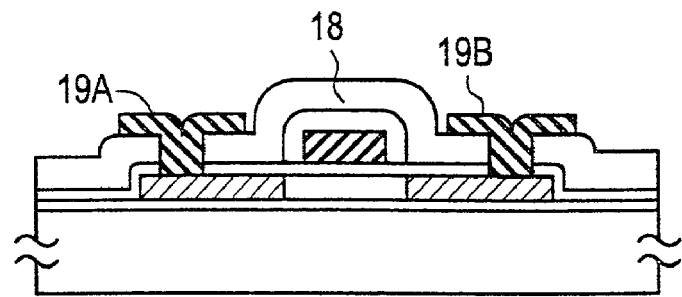

Finally, a silicon oxide film having a thickness of 5000 angstroms was deposited as an interlayer insulator 18 in the same manner as the fabrication method of normal TFTs, and contact holes were created therethrough to form wiring and electrodes 19A and 19B on the source and drain regions. Aluminum, titanium, titanium nitride or a multilayer film thereof is suitable for the wiring and electrode material. A multilayer film of titanium nitride (1000 angstroms thick) and aluminum (5000 angstroms thick) was used in this embodiment (FIG. 1(C)).

The TFT (N-channel type in the figure) was fabricated through the process described above. The field effect mobility of the TFT obtained was 40 to 60 $cm^2/Vs$ in the N-channel type and 30 to 50 $cm^2/Vs$ in the P-channel type. Further, the threshold voltage, field effect mobility and sub-threshold characteristic barely changed and high reliability could be obtained even when a voltage of from 17 to 25 V was applied for 48 hours between the gate and the drain. This is because the source, drain and channel forming region (the semiconductor region under the gate electrode) were crystallized simultaneously and their direction of crystallization is the same.

Second Embodiment

Figure 2A:
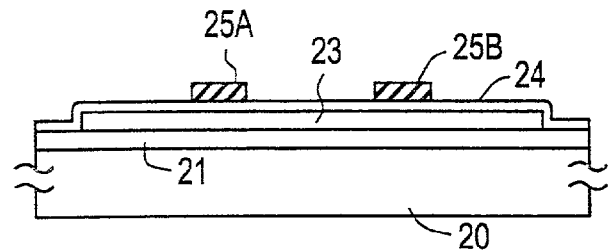
FIGS. 2(A) to 2(D) are section views showing a process of an embodiment of the present invention (refer to second embodiment)

A ground silicon oxide film 21 having a thickness of 2000 angstroms was formed on a substrate (Corning 7059) 20 by a plasma CVD method. Further, an amorphous silicon film having a thickness of 200 to 3000 angstroms or preferably 500 to 1500 angstroms was fabricated by a plasma CVD or vacuum CVD method. The amorphous silicon film could be easily formed by reducing the hydrogen concentration within the film to less than 5 atomic % by dehydrogenizing it by annealing for 0.1 to 2 hours at 350 to 450° C. It was then patterned to form an island silicon region 23. Then a silicon oxide film 24 having a thickness of 500 to 1500 angstroms which functions as a gate insulating film was formed by a RF plasma CVD, ECR plasma CVD or sputtering method. A favorable result could be obtained by using TEOS (tetraethoxisillane) and oxygen as original gases when the plasma CVD method was adopted. Then a polycrystal silicon film (5000 angstroms thick) containing 1% to 5% of phosphorus was deposited by a LPCVD method and patterned to form gate wiring and electrodes 25A and 25B (FIG. 2(A)).

After that, an impurity was diffused thereinto by an ion doping method to form N type impurity regions 26A and P type impurity regions 26B. At this time, phosphorus (doping gas is phosphine $PH_3$) can be used as the N type impurity for example to dope on the whole surface with 60 to 110 kV or 80 kV of acceleration voltage, for example, and then boron for example (doping gas is diborane $B_2H_6$) could be used as the P type impurity doped at an acceleration voltage of 40 to 80 kV or 65 kV, for example, to cover the region of the N channel type TFT by photoresist.

Figure 2B:
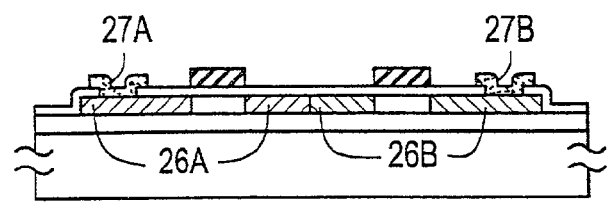

Further, holes were created in the silicon oxide film 24 on the impurity regions to form nickel silicide (or nickel) films 27A and 27B having a thickness of 200 to 1000 angstroms or 300 angstroms, for example, so that they adhere to the impurity regions 26 through the holes. Then annealing was carried out in a nitrogen atmosphere at 550° C. for four hours to crystallize the impurity regions 26 and other semiconductor regions. At this time, the crystal growth advances from both ends of the island semiconductor region and finishes around the middle thereof. Accordingly, no grain boundary was produced in the channel forming region and no detrimental effects were imposed on the characteristics of the TFT (FIG. 2(B)).

Figure 2C:
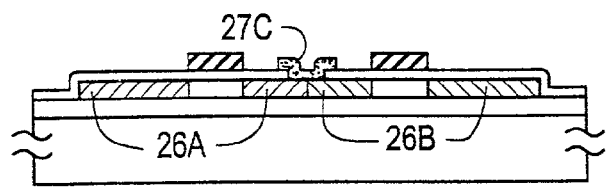
Figure 2D:
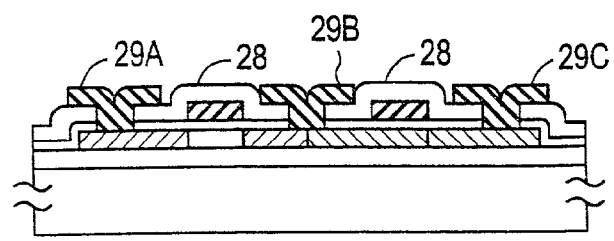
Figure 3A:
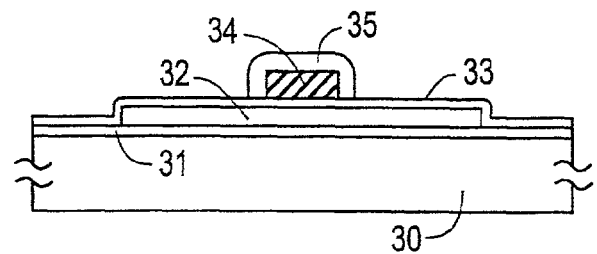
FIGS. 3(A) to 3(D) are section views showing a process of an embodiment of the present invention (refer to third embodiment)
Figure 3B:
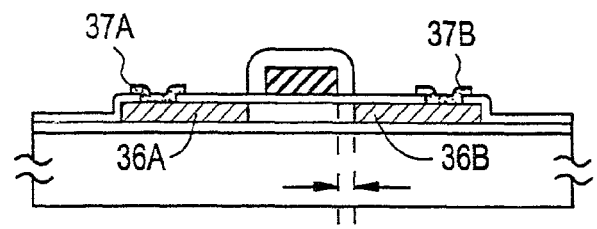
Figure 3C:
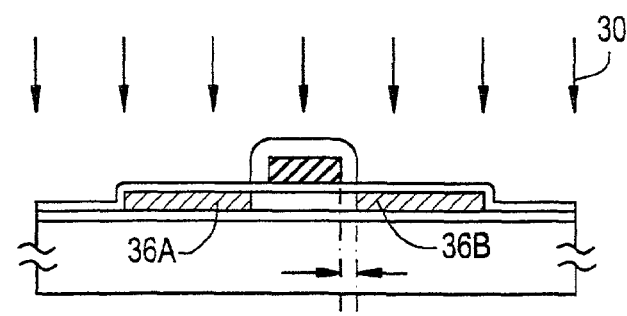
Figure 3D:
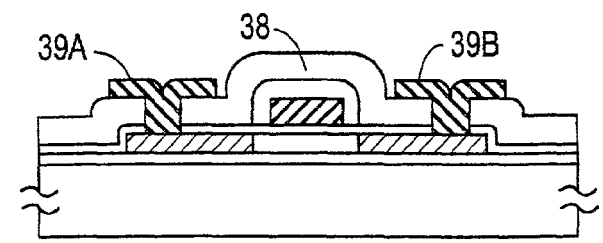

Alternatively, a nickel silicide film 27 C may be provided in the middle of the island semiconductor region as shown in FIG. 2(C). In this case, crystallization advances from the center (FIG. 2(C)).

Finally, a silicon oxide film having a thickness of 5000 angstroms was deposited as an interlayer insulator 28 in the same manner as the fabrication method of normal TFTs, and contact holes were created therethrough to form wiring and electrodes 29A, 29B and 29C on the source and drain regions. Aluminum, titanium, titanium nitride or a multilayer film thereof is suitable for the wiring and electrode material. A multilayer film of titanium nitride (1000 angstroms thick) and aluminum (5000 angstroms thick) was used in this case.

The CMOS type TFT was fabricated by the process described above. Then a shift register was fabricated using a CMOS circuit thus fabricated to study its operating characteristics. As a result, the maximum operating frequency was 11 MHz when the drain voltage was 15 V and 18 MHz when the drain voltage was 17 V.

Third Embodiment

The present embodiment relates to an arrangement in which the crystallinity of the semiconductor region is further improved by annealing it by radiating it with laser beams following crystallization by means of heating, as in the process of the first embodiment.

The fabricating process thereof will be explained below, referring to FIG. 3. A ground silicon oxide film 31 having a thickness of 2000 angstroms was formed on a substrate (Corning 7059) 30 by a plasma CVD method. Further, an amorphous silicon film having a thickness of 200 to 3000 angstroms or preferably 500 to 1500 angstroms was fabricated by a plasma CVD or vacuum CVD method. The amorphous silicon film could be easily crystallized by reducing hydrogen concentration within the film to less than 5 atomic % by dehydrogenizing it by annealing for 0.1 to 2 hours at 350 to 450° C. It was then patterned to form an island silicon region 32. Then a silicon oxide film 33 having a thickness of 500 to 1500 angstroms which functions as a gate insulating film was formed by a RF plasma CVD, ECR plasma CVD or a sputtering method. A favorable result could be obtained by using TEOS (tetraethoxisillane) and oxygen as original gases when the plasma CVD method was adopted.

Then a tantalum film (5000 angstroms thick) containing 1% silicon was deposited by a sputtering method and patterned to form gate wiring and an electrode 34. Titanium, silicon, chromium or aluminum may be used as the material of the gate electrode.

Then the substrate was soaked in an ethylene glycol solution of 3% tartaric acid and was anodized by setting platinum as the cathode and a tantalum wire as the anode and circulating a current therebetween. The current was applied so that its voltage rises 2V/min. and becomes constant when it reaches 220 V. The current was stopped when it was reduced to 10 micro $A/m^2$. As a result, an anodic oxide (tantalum oxide) 35 having a thickness of 2000 angstroms was formed. Similarly, titanium oxide, aluminum oxide or silicon oxide can be obtained as the anodic oxide when titanium, aluminum or silicon is used for the gate electrode (FIG. 3(A)).

Next, an impurity was introduced by a plasma doping method. As a doping gas, phosphine ($PH_3$) was used for the N type TFT and diborane ($B_2H_6$) was used for the P type TFT. The N type TFT is shown in the figure. The acceleration voltage used was 80 keV for phosphine and 65 keV for diborane. Impurity regions 36A and 36B were thus formed. At this time, the impurity regions and the gate electrode are offset as seen in the figure. Further, holes were created in the silicon oxide film 33 on the impurity regions to form nickel silicide (or nickel) films 37A and 37B so that they adhere to the semiconductor region 32 through the holes. Then annealing was carried out in a nitrogen atmosphere at 550° C. for four hours to crystallize the impurity regions 36A and 36B and other semiconductor regions (FIG. 3(B)).

Next, crystallization was promoted by radiating a KrF excimer laser (wavelength: 248 nm, pulse width: 20 nsec) thereon. Laser beam irradiation was carried out here in two shots with 200 to 400 $mJ/cm^2$ of energy density or 250 $mJ/cm^2$ of energy density. Further, at this time, the laser beam was radiated while heating the substrate up to 300° C. to increase the effect of the laser beam radiation. The substrate may be heated up to a temperature of between 200° C. and 450° C.

XeCl (wavelength: 308 nm), ArF (wavelength: 193 nm) or the like may be used as the laser beam. It is also possible to radiate a strong light instead of a laser beam. RTA (rapid thermal annealing) performed by radiating an infrared beam for a short time is particularly useful because it allows the silicon film to be heated selectively.

Thus a silicon film having good crystallinity may be obtained. As a result of such treatment, the region crystallized by thermal annealing became a silicon film having improved crystallinity. According to observation made through a transmission type electronic microscope, relatively large crystals of the same direction were observed in the region irradiated by the laser after the crystallization method of the present invention.

Finally, a silicon oxide film having a thickness of 5000 angstroms was deposited as an interlayer insulator 38 in the same manner as the fabrication method of normal TFTs, and contact holes were created therethrough to form wiring and electrodes 39A and 39B on the source and drain regions. Aluminum, titanium, titanium nitride or a multilayer film thereof is suitable for the wire and electrode material. A multilayer film of titanium nitride (1000 angstroms thick) and aluminum (5000 angstroms thick) was used in this embodiment. The TFT (N-channel type in the figure) was fabricated by the process described above (FIG. 3(C)).

Fourth Embodiment

The present embodiment is a method for introducing a catalytic element into an amorphous silicon film by a solution containing a catalytic element for accelerating crystallization.

Referring now to FIG. 4, the fabrication process thereof will be explained. Firstly, a ground silicon oxide film 41 having a thickness of 2000 angstroms was formed on a 10 cm square substrate (Corning 7059) 40 by a plasma CVD method. The amorphous silicon film having a thickness of 200 to 3000 angstroms or preferably 500 to 1500 angstroms was fabricated by a plasma CVD or vacuum CVD method. The amorphous silicon film could be easily crystallized by reducing the hydrogen concentration within the film to less than 5 atomic % by dehydrogenizing it by annealing for 0.1 to 2 hours at 350 to 450° C. It was then patterned to form an island silicon region 42.

Then a silicon oxide film 43 having a thickness of 500 to 1500 angstroms which functions as a gate insulating film was formed by RF plasma CVD, ECR plasma CVD or a sputtering method. A favorable result could be obtained by using TEOS (tetraethoxisilane) and oxygen as original gases when the plasma CVD method was adopted. Then a tantalum film (5000 angstroms thick) containing 1% of silicon was deposited by a sputtering method and was patterned to form gate wiring and an electrode 44. Titanium, silicon, chromium or aluminum may be used as the material of the gate electrode.

Then the substrate was soaked in an ethylene glycol solution of 3% tartaric acid and anodized by setting platinum as the cathode and tantalum wire as the anode and by circulating a current therebetween. The current was applied such that its voltage rises 2V/min. and becomes constant when it reaches 220 V. The current was stopped when it was reduced to 10 micro A/$m^2$. As a result, an anodic oxide (tantalum oxide) 45 having a thickness of 2000 angstroms was formed. Similarly, titanium oxide, aluminum oxide or silicon oxide can be obtained as the anodic oxide when titanium, aluminum or silicon is used for the gate electrode (FIG. 4(A)).

Next, an impurity was introduced by a plasma doping method. As a doping gas, phosphine ($PH_3$) was used for the N type TFT and diborane ($B_2H_6$) was used for the P type TFT. The N type TFT is shown in the figure. The acceleration voltage was 80 keV for phosphine and 65 keV for diborane. Impurity regions 46A and 46B were thus formed. At this time, the impurity regions and the gate electrode are offset as seen in the figure (FIG. 4(B)).

Further, holes were created in the silicon oxide film 43 on the impurity regions. Then a thin silicon oxide film 51 was formed by radiating an ultraviolet beam thereon for five minutes in an oxygen atmosphere. The thickness of this silicon oxide film 51 was assumed to be around 20 to 50 angstroms.

This silicon oxide film was formed to improve the wettability of a solution applied in a later process. In this state, 5 ml of acetate solution into which 100 ppm (reduced weight) of nickel was added was dripped (in the case of the 10 cm square substrate). At this time, a homogeneous water film 52 was formed on the entire surface of the substrate by spin-coating it for 10 seconds at 50 rpm by means of a spinner 41. Further, after holding the substrate for five minutes in this state, it was spin-dried for 60 seconds at 2000 rpm using the spinner 41. Incidentally, it may be held on the spinner while rotating it from 0 to 150 rpm (FIG. 4(C)).

Figure 4A:
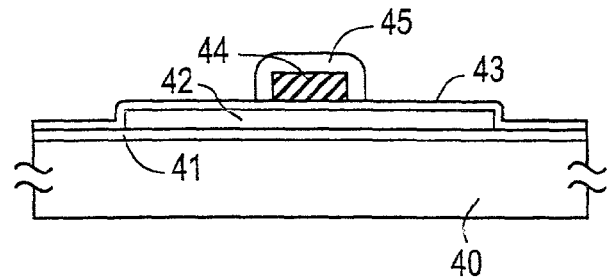
FIGS. 4(A) to 4(D) are section views showing a process of an embodiment of the present invention (refer to fourth embodiment)
Figure 4B:
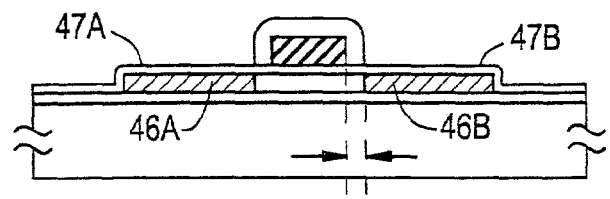
Figure 4C:
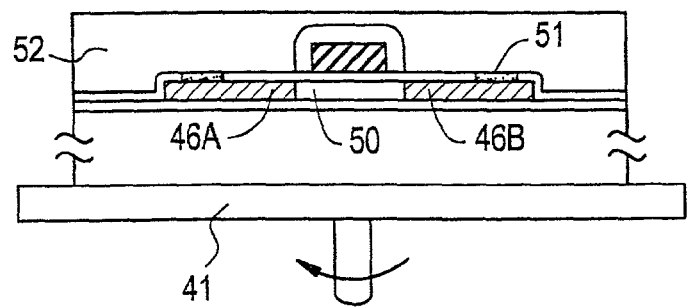
Figure 4D:
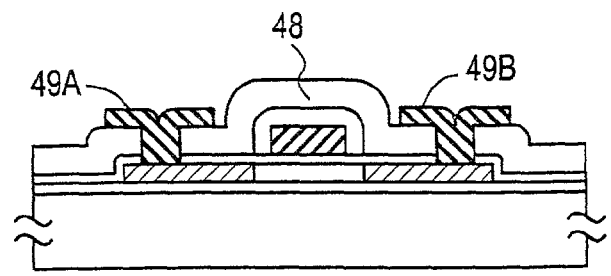

By the way, although FIG. 4(C) is drawn as if the substrate 40 on which one TFT is provided is placed on the spinner 41, actually a large number of TFTs are formed on the substrate 40.

Then, the amorphous silicon film 42 was crystallized by heat treating it for four hours at 550° C. (in a nitrogen atmosphere). At this time, the crystal grew in the horizontal direction from the region into which nickel was introduced (the region contacting with an oxide film 51) to the region into which no nickel was introduced.

It is effective to improve the crystallinity of the crystalline silicon film by irradiating it with a laser or equivalent strong light to obtain the film described in the third embodiment. Because nickel concentration within the silicon film was relatively high in the third embodiment, nickel within the silicon film precipitated and grains of nickel silicide of around 0.1 to 10 microns were formed within the silicon film by the laser radiation, thus worsening the morphology of the film. However, because the present embodiment allows reduction of the nickel concentration to a greater extent than the third embodiment, no nickel silicide precipitated and the film could be prevented from being roughened by laser irradiation.

Figure 5:
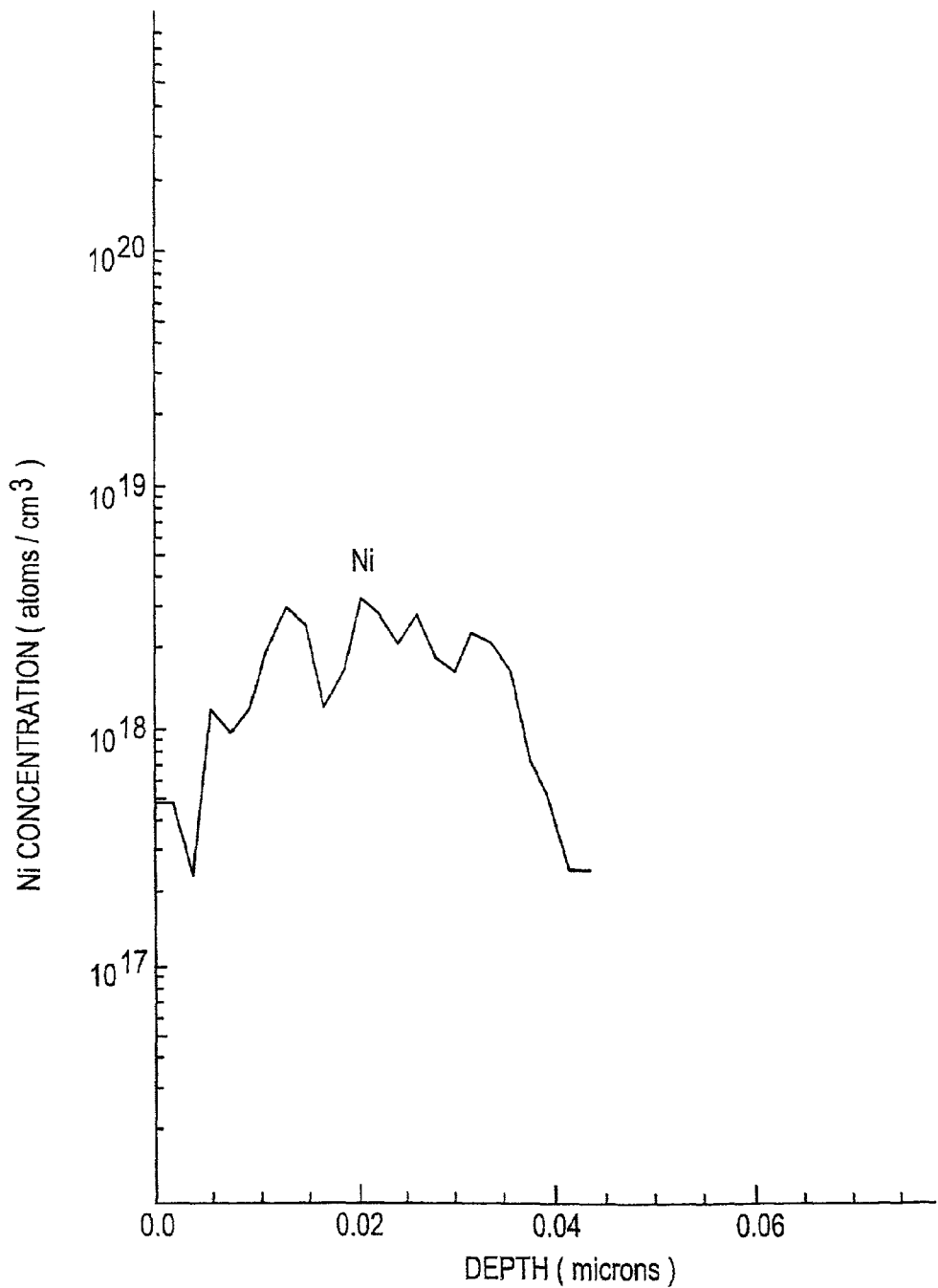
FIG. 5 is a graph showing nickel concentration within crystal silicon (refer to fourth embodiment).

FIG. 5 shows a study result on the nickel concentration in a region denoted by the reference number 50 after finishing the crystallization process in SIMS. This region is a region crystallized by the crystal growth from the region into which nickel was directly introduced and functions as a channel forming region of the TFT. It was confirmed that the concentration of nickel in the region where nickel was directly introduced presents a concentration higher than the concentration distribution shown in FIG. 5 by one digit. That is, it was confirmed that the nickel concentration of the channel forming region was less by more than one digit as compared to the nickel concentration of the source/drain region of the TFT after completion, as shown in FIG. 5.

The nickel concentration shown in FIG. 5 can be controlled by controlling the nickel concentration within the solution. While the nickel concentration in the solution was 100 ppm in the present embodiment, it was found that it would be possible to crystallize even with 10 ppm of nickel concentration. In this case, the nickel concentration shown in FIG. 5 can be further reduced by one digit. However, a problem arises when the nickel concentration within the solution is reduced, in that the distance of crystal growth in the horizontal direction from the region into which nickel is introduced is shortened.

Finally, a silicon oxide film having a thickness of 5000 angstroms was deposited as an interlayer insulator 48 in the same manner as the fabrication method of normal TFTs, and contact holes were created therethrough to form wiring and electrodes 49A and 49B on the source and drain regions. Aluminum, titanium, titanium nitride or a multilayer film thereof is suitable for the wiring and electrode material. A multilayer film of titanium nitride (1000 angstroms thick) and aluminum (5000 angstroms thick) was used in this case.

Although the acetate solution was used as the solution containing the catalytic element in the present embodiment, it is possible to use an aqueous solution, organic solvent solution or the like. Here the catalytic element may be contained not as a compound but merely as a dispersed substance.

One solvent chosen from water, alcohol, acid and ammonia, which are polar solvents, may be used as the solvent for containing the catalytic element.

When nickel is used as the catalyst and is contained in the polar solvent, it is introduced as a nickel compound. As the nickel compound, one compound chosen from among nickel bromide, nickel acetate, nickel oxalate, nickel carbonate, nickel chloride, nickel iodide, nickel nitride, nickel sulfate, nickel formate, nickel acetylacetonate, nickel 4-cyclohexyl butyric acid, nickel oxide and nickel hydroxide is typically used.

For the solvent, one chosen from among benzene, toluene, xylene, carbon tetrachloride, chloroform and ether, which are non-polar solvents, may be used.

In this case, nickel is introduced as a nickel compound. One chosen compound from among nickel acetylacetonate and nickel 2-ethylhexanodic acid is typically used as the nickel compound.

It is also useful to add a surface active agent to the solution containing the catalytic element to improve its adhesiveness to the surface to be applied and to control its adsorption. It is possible to apply the surface active agent on the surface to be applied beforehand. A simple substance nickel must be dissolved by an acid into a solution when it is used as the catalytic element.

Although the case in which the solution into which nickel, the catalytic element, was completely dissolved was used has been described above, it is possible to use materials such as an emulsion in which powder composed of the simple substance nickel or nickel compound is dispersed homogeneously within a dispersion medium without dissolving the nickel completely. As such a solution, OCD (Ohka Diffusion Source) available from Tokyo Ohka Kogyo Co., Ltd. may be used. The use of the OCD solution allows easy formation of a silicon oxide film by applying it on the surface for forming the film and by baking it at around 200° C. Further, because it allows impurities to be added freely, they can be used.

The aforementioned description applies also to a case wherein a material other than nickel is used as the catalytic element.

Furthermore, the use of a non-polar solvent such as a toluene solution of nickel 2-ethylhexanodic acid as the solution allows directly application on the surface of the amorphous silicon film. In this case, it is effective to apply such a material as an adhesive used in applying resists beforehand. However, one must be careful not to apply the solution too much because doping of the catalytic element into the amorphous silicon is impaired.

While the amount of the catalytic element contained in the solution depends on the type of solution, it is desirable that it be 200 ppm to 1 ppm or preferably 50 ppm to 1 ppm (reduced weight) to the solution as a general tendency. This value is determined in consideration of the nickel concentration within the film and hydrofluoric acid resistance after completion of crystallization.

As described above, the present invention allows control of the direction of crystal growth, which has been difficult in the past, and allows remarkable improvement of the reliability and yield of thin film transistors. Further, because the facilities, apparatuses and techniques necessary for the present invention are very general and are excellent in terms of mass-producibility, the present invention contributes an immeasurable benefit to the industry. Thus the present invention is industrially beneficial and worthy of patent.

While the present invention has been particularly shown and described with reference to preferred embodiments thereof, it should be understood by those skilled in the art that the foregoing and other changes in form and details can be made therein without departing from the spirit and scope of the present invention.

These are some methods to perform solid phase crystallization by using a metal catalyst. In using such metal catalyst elements, including Ni, Fe, Co, Ru, Rh, Pd, Os, Ir, Pt, Cu, Au, etc., the conventional method was physical formation such as sputtering method, electron beam evaporation method, etc.

In this case, a film including the catalyst of 5 to 200 Å in average thickness, e.g. 10 to 50 Å thick is formed in an island-form on a surface. That is, the catalyst element is dotted on the surface in the form of micrograins with an average diameter of 50 to 200 Å. The grain are separated from each other by approximately 100 to 1000 Å. In other words, it does not form a continuous film in any way, but forms a discontinuous film. Consequently, the metal islands form nuclei for crystallization. Crystals are grown from the nuclei in an amorphous silicon film on an insulating substrate by means of a thermal treatment at 450° C. to 600° C.

In the above conventional method, the crystallization temperature can be dropped by 50 to 100° C., in comparison to when such catalyst elements are not used for the crystallization. However, the following thing became clear as a result of observing the crystallized film carefully. A number of amorphous regions are left and that such regions have a metallic property. It is presumed that the metal catalyst is left as they are.

These metal regions form recombination centers of electrons and halls. Adding a reverse bias voltage to a semiconductor device, in particular, PI or NI junction because of the metal region existing in the junction region, it has quite inferior characteristics in that a leak current is increased. When thin-film transistors of channel length/channel width=8 µm/8 µm is formed with such a semiconductor layer, the Off-state current is $10^{-10}$ to $10^{-6}$ A, which is $10^2$ to $10^6$ times larger than $10^{12}$ although an OFF=–state current should be as small as about $10^{12}$ Å.

The present invention aims at giving the chemical formation method which is quite different from above. In order to solve the problem above, it is a characteristic of the present invention to form a catalytic layer by using a solution (water, isopropyl alcohol, etc.) which contains a metal organic compound at a concentration 10 ppm to 100 ppm. For example, the following metal complex salt can be used as the metal compound. Namely, ferrous bromide ($FeBr_2 6H_2O$), ferric bromide ($FeBr_3 6H_2O$), ferric acetate ($Fe(C_2H_3O_2)_3 xH_2O$), ferrous chloride ($FeCl_2 4H_2O$), ferric chloride ($FeCl_3 6H_2O$), ferric fluoride ($FeF_3 3H_2O$), ferric nitrate ($Fe(NO_3)_3 9H_2O$), ferrous phosphate ($Fe_3(PO_4)_2 8H_2O$), ferric phosphate ($FePO_4 2H_2O$), cobalt bromide ($CoBr 6H_2O$), cobalt acetate ($Co(C_2H_3O_2)_2 4H_2O$), cobalt chloride ($CoCl_2 6H_2O$), cobalt fluoride ($CoF_2 xH_2O$), cobalt nitrate ($Co(NO_3)_2 6H_2O$), ruthenium chloride ($RuCl_3 H_2O$), rhodium chloride ($RhCl_3 3H_2O$), palladium chloride ($PdCl_2 2H_2O$), osmium chloride ($OsCl_3$), iridium trichloride ($IrCl_3 3H_2O$), iridium tetrachloride ($IrCl_4$), platinic chloride ($PtCl_4 5H_2O$), cupric acetate ($Cu(CH_3COO)_2$), cupric chloride ($CuCl_2 2H_2O$), cupric nitrate ($Cu(NO_3)_2 3H_2O$), auric trichloride ($AuCl_3 xH_2O$), auric chloride ($AuHCl_4 4H_2O$), sodium auric tetrachloride ($AuNaCl_4 2H_2O$).

The above materials can be dispersed in a solution in a monomolecular form. This solution can be spread on an entire surface of a substrate by spin coating in which the solution is dropped and then the substrate is rotated at a rotational speed of 50 to 500 r.p.m.

When a silicon oxide film of 5 to 100 Å thick is formed on the surface of a silicon semiconductor in order to improve a wettability of the silicon surface with respect to the solution, this thin film can prevent the solution from becoming spot condition by the surface tension of liquid. It is also practicable to improve the wettability of semiconductor silicon without a silicon oxide film by adding a surface active agent into the solution.

In these methods, the metal catalyst atoms can be dispersed into semiconductor through the oxide film. In particular, it is possible to promote a crystallization without forming crystal nuclei in the form of grains. Therefore, it is a favorable method.

It is also useful to coat the organic metal uniformly and a UV treatment (ozone treatment) in oxygen is performed for formation of a metal oxide film. In this case, oxidized organic substance can be vaporized and removed as carbon dioxide, so it is possible to make the solid phase growth more uniform.

When the spin coating is carried out only at low rational speed, too much metal constituent for solid phase growth is apt to be supplied into the semiconductor film. Therefore, after the rotation at a low speed, the substance is rotated at 1000 to 10,000 r.p.m., e.g., 2000 to 5000 r.p.m. Thus, an excess organic metal can be eliminated from the surface of substrate and the surface can be dried sufficiently. Moreover, it is effective to control the amount of the organic metal to be formed on the surface. In the above chemical formation method, a continuous layer can be formed on a surface of semiconductor without forming nuclei of metal particles for crystallization.

A metal catalyst layer becomes inhomogeneous layer when it is formed by a physical formation method, on the other hand, it becomes homogeneous layer when it is formed by a chemical method as is the case in the present invention.

In accordance with the above new concept, the crystals can be grown far more uniformly on an entire surface of the semiconductor film when the crystallization is performed by thermal treatment which is performed at 450° C. to 650° C. Therefore, it is possible to form excellent P—I and N—I junctions by using the thus crystallized semiconductor film. In this case, the leak is controlled to be as small as $10^{-12}$ A even if a reverse bias voltage is applied.

In the case of a physical method, 90 to 100 out of 100 P—I junctions have a large leak current, that is $10^{-10}$ to $10^{-5}$ A and 50 to 70 out of 100 N—I junctions have $10^{-12}$ to $10^{-6}$ leak current. On the other hand, in the chemical method of the present invention, 5 to 20 out of 100 P—I junctions have a leak current as small as $10^{-13}$ to $10^{-8}$ A and 0 to 20 out of 100 N—I junctions have a leak current as small as $10^{-13}$ to $10^{-8}$ A. So, the present invention improves the characteristics quite remarkably because both an OFF-state current and the probability of a film that leak current is large are reduced.

Besides, the fine effect can be obtained in both P-channel TFTs (having a PIP junctions) and N-channel TFTs (having a NIN junctions) by forming the above semiconductor film on an insulating surface. Moreover, the present invention can reduce the probability by about 1 or 2 orders that TFTs having large leak current are formed. However, if the TFTs are used for making thin film IC, the probability which TFTs having large current are formed should be decreased $1/10^3$ to $1/10^9$.

In the present invention, after the thermal crystallization, a laser light having a wavelength 248 nm or 308 nm is irradiated on the surface of the semiconductor with the energy density being at 250 to 400 mJ/cm². The absorption of light is larger in the region that metal constituent exist largely compared to the silicon region crystallized. That is, the region which remains an amorphous structure becomes black optically while the crystal constituent is transparent. Because of this, the slightly remaining amorphous component can be melted by the irradiation of the laser light selectively. Further, the metal existing in the amorphous component can be dispersed to an atomic level in this manner.

As a result, it was possible to reduce the possibility that the metal regions are formed a recrystallized film, and it was possible to reduce the leak current of a TFT to $10^{-13}$ to $10^{-12}$ A, and further, when $10^4$ to $10^8$ pieces of TFTs were manufactural, only 1-3 of them had an undesirable large leak current. This is because the metal regions which form recombination centers and cause the increase in a leak current are removed from the semiconductor film.

By spin coating in the present method, the leak current of the reversed direction i.e. Ioff is reduced by two orders, and the probability which TFTs having a large leak current exist can be reduced by two orders. Nevertheless, TFTs having a large leak current are formed. Assumably, the cause of forming such defective TFTs is that dust adheres to the surface of the semiconductor, on which organic metal concentrates. The characteristic can be improved by the improvement of experimental equipment.

An experiment was conducted in which laser light was irradiated to a film which was obtained by forming a catalyst metal through a conventional physical formation method and heat crystallizing. In this case, however, an OFF current could not be reduced at all at P—I or N—I junctions when a reverse bias voltage was applied, even if the semiconductor is fused by the irradiation of laser light for recrystallization because metal grains in the starting film tend to be too big.

Accordingly, the method which utilizes a chemical formation method for forming a continuous layer of an organic metal catalyst is entirely different from the conventional method which utilizes a physical formation method followed by a thermal crystallization process. It is clearly understood that the chemical formation method is superior.

Instead of using a solution for forming the continuous catalyst layer, it is possible to utilize a CVD method with an organic metal gas as a starting material. The method is quite effective in order to reduce both an OFF current and the probability which TFTs having a large leak current exist. Further, the process of the present invention is a homogeneous crystal growth, that is, isotropic growth by using metal catalyst. On the other hand, the process of the conventional method is a non-uniform crystal growth, that is, a non-isotropic growth by using metal nuclei.

In the present invention, there are two ways as to how the crystal growth occurs; one is that the crystals are grown in the transverse direction with the surface of the substrate and the other is that the crystals are grown in the vertical direction with the surface of the substrate from the lower side of the semiconductor to the upper side thereof or vice versa. In either case, it was possible to obtain a semiconductor having an excellent electrical characteristics.

What is claimed is:
1. A transistor comprising:
   a channel region; and
   at least one of a source region and a drain region having a first crystalline portion adjacent to the channel region and a second crystalline portion adjacent to the first crystalline portion, wherein the second crystalline portion is a region where a metal was directly added, and
   wherein the first crystalline portion is a region where crystallization advanced from the second crystalline portion.
2. The transistor according to claim 1, further comprising a gate insulating film over the channel region, the first crystalline portion, and the second crystalline portion,
   wherein the gate insulating film has an opening overlapping with the second crystalline portion.
3. The transistor according to claim 1,
   wherein the metal is nickel.
4. The transistor according to claim 1,
   wherein the metal is at least one from the group consisting of nickel, iron, cobalt, platinum, and palladium.
5. A transistor comprising:
   a channel region; and at least one of a source region and a drain region having a first crystalline portion adjacent to the channel region and a second crystalline portion adjacent to the first crystalline portion, wherein the second crystalline portion has a surface through which a metal is added, and wherein the first crystalline portion is a region where crystallization advanced from the second crystalline portion.

6. The transistor according to claim 5, further comprising a gate insulating film over the channel region, the first crystalline portion, and the second crystalline portion, wherein the gate insulating film has an opening overlapping with the second crystalline portion.

7. The transistor according to claim 5,
wherein the metal is nickel.

8. The transistor according to claim 5,
wherein the metal is at least one from the group consisting of nickel, iron, cobalt, platinum, and palladium.

9. A transistor comprising:
a channel region; and
at least one of a source region and a drain region having a first crystalline portion adjacent to the channel region and a second crystalline portion adjacent to the first crystalline portion, wherein the second crystalline portion is a region where a metal was directly added, wherein the first crystalline portion is a region where crystallization advanced from the second crystalline portion, and wherein a crystal of the first crystalline portion is a crystal which grew in a horizontal direction from the second crystalline portion.

10. The transistor according to claim 9, further comprising a gate insulating film over the channel region, the first crystalline portion, and the second crystalline portion, wherein the gate insulating film has an opening overlapping with the second crystalline portion.

11. The transistor according to claim 9,
wherein the metal is nickel.

12. The transistor according to claim 9,
wherein the metal is at least one from the group consisting of nickel, iron, cobalt, platinum, and palladium.

13. A transistor comprising:
a channel region; and
at least one of a source region and a drain region having a first crystalline portion adjacent to the channel region and a second crystalline portion adjacent to the first crystalline portion, wherein the second crystalline portion has a surface through which a metal is added, and wherein the first crystalline portion is a region where crystallization advanced from the second crystalline portion, and wherein a crystal of the first crystalline portion is a crystal which grew in a horizontal direction from the second crystalline portion.

14. The transistor according to claim 13, further comprising
a gate insulating film over the channel region, the first crystalline portion, and the second crystalline portion, wherein the gate insulating film has an opening overlapping with the second crystalline portion.

15. The transistor according to claim 13,
wherein the metal is nickel.

16. The transistor according to claim 13,
wherein the metal is at least one from the group consisting of nickel, iron, cobalt, platinum, and palladium.

* * * * *

UNITED STATES PATENT AND TRADEMARK OFFICE
CERTIFICATE OF CORRECTION

PATENT NO. : 7,952,097 B2
APPLICATION NO. : 09/917633
DATED : May 31, 2011
INVENTOR(S) : Shunpei Yamazaki et al.

It is certified that error appears in the above-identified patent and that said Letters Patent is hereby corrected as shown below:

Column 1, line 37, "goad" should read "good"

Column 3, line 57, "than atomic %" should read "than 5 atomic %"

Column 4, line 18, "80 key" should read "80 keV"

Signed and Sealed this
Twenty-seventh Day of December, 2011

David J. Kappos
*Director of the United States Patent and Trademark Office*